United States Patent
Lee et al.

(10) Patent No.: US 9,921,436 B2
(45) Date of Patent: Mar. 20, 2018

(54) THIN FILM TRANSISTOR SUBSTRATE AND LIQUID CRYSTAL DISPLAY INCLUDING THE SAME

(71) Applicant: SAMSUNG DISPLAY CO., LTD., Yongin-si, Gyeonggi-Do (KR)

(72) Inventors: Hee Hwan Lee, Hwaseong-si (KR); Kyu Su Ahn, Seoul (KR); Kyung Ho Kim, Seongnam-si (KR); Kee Bum Park, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/265,755

(22) Filed: Sep. 14, 2016

(65) Prior Publication Data

US 2017/0003557 A1   Jan. 5, 2017

Related U.S. Application Data

(63) Continuation of application No. 14/661,965, filed on Mar. 18, 2015, now Pat. No. 9,448,455.

(30) Foreign Application Priority Data

Oct. 21, 2014   (KR) ........................ 10-2014-0142526

(51) Int. Cl.
*G02F 1/1343* (2006.01)
*G02F 1/1362* (2006.01)
(Continued)

(52) U.S. Cl.
CPC ...... *G02F 1/134309* (2013.01); *G02F 1/1368* (2013.01); *G02F 1/13439* (2013.01);
(Continued)

(58) Field of Classification Search
CPC .......... G02F 1/134309; G02F 1/13439; G02F 1/136286; G02F 1/136227;
(Continued)

(56) References Cited

U.S. PATENT DOCUMENTS

2010/0182298 A1   7/2010   Song
2011/0069267 A1   3/2011   Moon et al.
(Continued)

FOREIGN PATENT DOCUMENTS

KR   10-2007-0002223 A   1/2007
KR   10-2008-0038798 A   5/2008
KR   10-2013-0104521 A   9/2013

*Primary Examiner* — Donald Raleigh
(74) *Attorney, Agent, or Firm* — Innovation Counsel LLP

(57) ABSTRACT

A thin film transistor array panel includes a first subpixel electrode and a second subpixel electrode electrically connected with a drain electrode through a first contact hole and a second contact hole, respectively. The first subpixel electrode and the second subpixel electrode include a plurality of vertical stems, a plurality of horizontal stems, and a plurality of branch electrodes. The first subpixel electrode is formed above a gate line and the second subpixel electrode is formed below a gate line. The thin film transistor array panel further includes a first protrusion formed in the plurality of vertical stems of the first subpixel electrode and the plurality of vertical stems of the second subpixel electrode.

20 Claims, 17 Drawing Sheets

(51) Int. Cl.
    *G02F 1/1368* (2006.01)
    *G02F 1/1333* (2006.01)
    *H01L 27/12* (2006.01)
    *H01L 29/786* (2006.01)
    *G02F 1/1335* (2006.01)

(52) U.S. Cl.
    CPC .. *G02F 1/133345* (2013.01); *G02F 1/136227* (2013.01); *G02F 1/136277* (2013.01); *G02F 1/136286* (2013.01); *H01L 27/124* (2013.01); *H01L 29/78633* (2013.01); *G02F 1/133514* (2013.01); *G02F 2001/134345* (2013.01); *G02F 2001/136218* (2013.01); *G02F 2201/121* (2013.01); *G02F 2201/123* (2013.01)

(58) Field of Classification Search
    CPC ............. G02F 1/136277; G02F 1/1368; G02F 1/133345; G02F 2201/123; G02F 2201/121; G02F 1/133514; G02F 2001/134; H01L 29/78633; H01L 27/124
    See application file for complete search history.

(56) References Cited

U.S. PATENT DOCUMENTS

| | | |
|---|---|---|
| 2011/0242468 A1 | 10/2011 | Choi et al. |
| 2012/0249940 A1 | 10/2012 | Choi et al. |
| 2013/0229608 A1 | 9/2013 | Lee et al. |
| 2014/0043554 A1 | 2/2014 | No et al. |
| 2014/0043571 A1* | 2/2014 | Chang .................... G02F 1/139 349/123 |

* cited by examiner

THIN FILM TRANSISTOR SUBSTRATE AND LIQUID CRYSTAL DISPLAY INCLUDING THE SAME

CROSS-REFERENCE TO RELATED APPLICATION

This application is a continuation application of U.S. patent application Ser. No. 14/661,965, filed Mar. 18, 2015, which claims priority to and the benefit of Korean Patent Application No. 10-2014-0142526 filed in the Korean Intellectual Property Office on Oct. 21, 2014, the entire contents of which are incorporated herein by reference.

BACKGROUND (a) Technical Field

The present disclosure generally relates to a thin film transistor array panel and a liquid crystal display including the same.

(b) Description of the Related Art

A liquid crystal display device, which is one of the most common types of flat panel displays currently in use, typically includes two display panels with field generating electrodes (such as a pixel electrode, a common electrode, and the like) and a liquid crystal layer interposed therebetween. In the liquid crystal display, an electric field is generated in the liquid crystal layer by applying a voltage to the field generating electrodes. The electric field determines the alignment of liquid crystal molecules of the liquid crystal layer, thereby controlling polarization of incident light passing through the liquid crystal layer so as to display images.

When the liquid crystal display is used as a display device for a television, the liquid crystal display screen size is increased. However, when the liquid crystal display screen size is increased, a viewing difference between an image (as observed by a viewer positioned center to the screen) and the image (as observed by a viewer positioned at the far left or right end of the screen) also increases.

In order to compensate for the viewing difference, the display device may be formed in a curved shape (e.g., a concave shape or a convex shape). In some cases, the display device may be provided in a portrait configuration (whereby its vertical length is longer than the horizontal length) and bent in a vertical direction relative to the viewer. In other cases, the display device may be provided in a landscape configuration (whereby its vertical length is shorter than the horizontal length) and bent in a horizontal direction relative to the viewer.

The two display panels in the liquid crystal display device typically consist of an upper substrate and a lower substrate. When the display device is bent to form a liquid crystal display with a curved shape, a front end stress will be exerted on a portion of the substrate that is positioned inward of a curved surface between the upper and lower substrates, causing the upper and lower substrates to misalign. Subsequently, the misalignment between the upper and lower substrates may generate a texture in the displayed image.

The above information disclosed in this Background section is only to enhance understanding of the background of the inventive concept and therefore it may contain information that does not form the prior art that is already known in this country to a person of ordinary skill in the art.

SUMMARY

The present disclosure addresses at least the above issues relating to texture in the displayed image due to misalignment between the upper and lower substrates. Specifically, the present disclosure provides a thin film transistor array panel in which a stem of a pixel electrode and a stem of a divided reference voltage line are formed horizontally to reduce texture in a curve-type display panel. Also, a step or a protrusion is formed in the stem of the pixel electrode to prevent a dark portion from being generated in the stem of the pixel electrode.

According to an embodiment of the inventive concept, a thin film transistor array panel includes: a first substrate; a gate line and a plurality of storage electrode lines formed on the first substrate; a gate insulating layer formed on the gate line; a semiconductor layer formed on the gate insulating layer; a data line, a drain electrode, and a divided reference voltage line formed on the semiconductor layer; a passivation layer covering the data line, the drain electrode, and the divided reference voltage line, wherein a first contact hole and a second contact hole are formed in the passivation layer partially exposing the drain electrode; a first subpixel electrode and a second subpixel electrode electrically connected with the drain electrode through the first and second contact holes, respectively, wherein the first subpixel electrode and the second subpixel electrode include a plurality of vertical stems, a plurality of horizontal stems, and a plurality of branch electrodes, and wherein the first subpixel electrode is formed above the gate line and the second subpixel electrode is formed below the gate line; and a first protrusion formed in the plurality of vertical stems of the first subpixel electrode and the plurality of vertical stems of the second subpixel electrode.

In some embodiments, the first protrusion may protrude from an area occupied by the vertical stems.

In some embodiments, the divided reference voltage line may divide a first subpixel area corresponding to the first subpixel electrode into a first area and a second area, and surround three sides of each of the first and second areas. The divided reference voltage line may further divide a second subpixel area corresponding to the second subpixel electrode into a third area and fourth area, and surround three sides of each of the third and fourth areas. In addition, sides of the first subpixel area where the divided reference voltage line are not formed may be disposed opposite to each other in the first and second areas, and sides of the second subpixel area where the divided reference voltage line are not formed may be disposed opposite to each other in the third and fourth areas.

In some embodiments, each of the first and second subpixel electrodes may include a first horizontal stem and a second horizontal stem extending in a horizontal direction and a first vertical stem and a second vertical stem extending in a vertical direction. The first vertical stem may be perpendicular to the first horizontal stem and formed at one end of the first horizontal stem. The second vertical stem may be perpendicular to the second horizontal stem and formed at one end of the second horizontal stem. The first vertical stem and the second vertical stem may be disposed opposite to each other.

In some embodiments, a portion of minute branches extending from the first horizontal stem of the first subpixel electrode and a portion of minute branches extending from the second horizontal stem of the first subpixel electrode may be connected with each other, and a portion of the minute branches extending from the second horizontal stem toward the gate line may be connected with a widened portion of the first subpixel electrode and receive a voltage from the drain electrode through the first contact hole.

In some embodiments, a portion of minute branches extending from the second horizontal stem of the first subpixel electrode and a portion of the minute branches extending from the second horizontal stem of the first subpixel electrode may be connected with each other, and a portion of the minute branches extending from the first horizontal stem toward the gate line may be connected with a widened portion of the second subpixel electrode and receive a voltage from the drain electrode through the second contact hole.

In some embodiments, the first vertical stem of the first subpixel electrode and the first vertical stem of the second subpixel electrode may overlap the divided reference voltage line, and the divided reference voltage line may be formed crossing between the minute branches extending from the first horizontal stems of the first and second subpixel electrodes and the minute branches extending from the second horizontal stems of the first and second subpixel electrodes.

In some embodiments, the thin film transistor array panel may further include a shielding electrode disposed in the same layer as the first and second subpixel electrodes, wherein the shielding electrode may extend vertically along a pixel area defined by the first and second subpixel electrodes, and the shielding electrode may include a vertical portion overlapping the data line and a horizontal portion crossing between the first subpixel electrode and the second subpixel electrode. In some embodiments, the protrusion may further include a second protrusion protruding from at least a portion of the horizontal stems.

In some embodiments, the first protrusion may protrude from an area occupied by the vertical stems.

In some embodiments, each of the first subpixel electrode and the second subpixel electrode may include a first horizontal stem and a second horizontal stem extending in a horizontal direction and a first vertical stem and a second vertical stem extending in a vertical direction. The first vertical stem may be perpendicular to the first horizontal stem and formed at one end of the first horizontal stem. The second vertical stem may be perpendicular to the second horizontal stem and formed at one end of the second horizontal stem. The first vertical stem and the second vertical stem may be disposed opposite to each other.

In some embodiments, the first protrusion may protrude at points where the vertical stems and the horizontal stems intersect each other.

According to another embodiment of the inventive concept, a liquid crystal display includes: a first substrate; a gate line and a plurality of storage electrode lines formed on the first substrate; a gate insulating layer formed on the gate line; a semiconductor layer formed on the gate insulating layer; a data line, a drain electrode, and a divided reference voltage formed on the semiconductor layer; a passivation layer covering the data line, the drain electrode, and the divided reference voltage line, wherein a first contact hole and a second contact hole are formed in the passivation layer partially exposing the drain electrode; a first subpixel electrode and a second subpixel electrode electrically connected with the drain electrode through the first and second contact holes, respectively, wherein the first subpixel electrode and the second subpixel electrode include a plurality of vertical stems, a plurality of horizontal stems, and a plurality of branch electrodes, and wherein the first subpixel electrode is formed above the gate line and the second subpixel electrode is formed below the gate line; a second substrate disposed corresponding to the first substrate; a common electrode formed on the second substrate; and a liquid crystal layer disposed between the first substrate and the second substrate; and a first protrusion formed in the plurality of vertical stems of the first subpixel electrodes and the plurality of vertical stems of the second subpixel electrode.

In some embodiments, the first protrusion may protrude from an area occupied by the vertical stems.

In some embodiments, each of the first subpixel electrode and the second subpixel electrode may include a first horizontal stem and a second horizontal stem extending in a horizontal direction and a first vertical stem and a second vertical stem extending in a vertical direction. The first vertical stem may be perpendicular to the first horizontal stem and formed at one end of the first horizontal stem. The second vertical stem may be perpendicular to the second horizontal stem and formed at one end of the second horizontal stem. The first vertical stem and the second vertical stem may be disposed opposite to each other.

In some embodiments, the liquid crystal display may further include a shielding electrode disposed in the same layer as the first and second subpixel electrodes, wherein the shielding electrode may extend along a pixel area defined by the first subpixel electrode and the second subpixel electrode, and the shielding electrode may include a vertical portion overlapping the data line and a horizontal portion crossing between the first subpixel electrode and the second subpixel electrode.

In some embodiments, the protrusion may protrude from an area occupied by the vertical stems and at least a portion of the horizontal stems.

In some embodiments, the protrusion may protrude from points where the vertical stems and the horizontal stems intersect each other.

According to a further embodiment of the inventive concept, a thin film transistor array panel includes: a first substrate; a gate line and a plurality of storage electrodes formed on the first substrate; a gate insulating layer formed on the gate line; a semiconductor layer formed on the gate insulating layer; a data line, a drain electrode, and a divided reference voltage line formed on the semiconductor layer; a passivation layer covering the data line, the drain electrode, and the divided reference voltage line, wherein a first contact hole and a second contact hole are formed in the passivation layer partially exposing the drain electrode; a first subpixel electrode and a second subpixel electrode electrically connected with the drain electrode through the first and second contact holes, respectively, wherein the first subpixel electrode and the second subpixel electrode include a plurality of vertical stems, a plurality of horizontal stems, and a plurality of branch electrodes; and a protrusion formed at a portion where the first and second subpixel electrodes overlap the data line, wherein the protrusion protrudes to a same height as the data line.

In some embodiments, the liquid crystal display may further include: a second substrate disposed corresponding to the first substrate; a common electrode formed on the second substrate; and a liquid crystal layer disposed between the first substrate and the second substrate, wherein the first subpixel electrode may be disposed above the gate line and the second subpixel electrode may be disposed below the gate line, and wherein the first subpixel electrode and the second subpixel electrode may be formed horizontally and overlap an area where the data line is formed.

DETAILED DESCRIPTION

Figure 1:
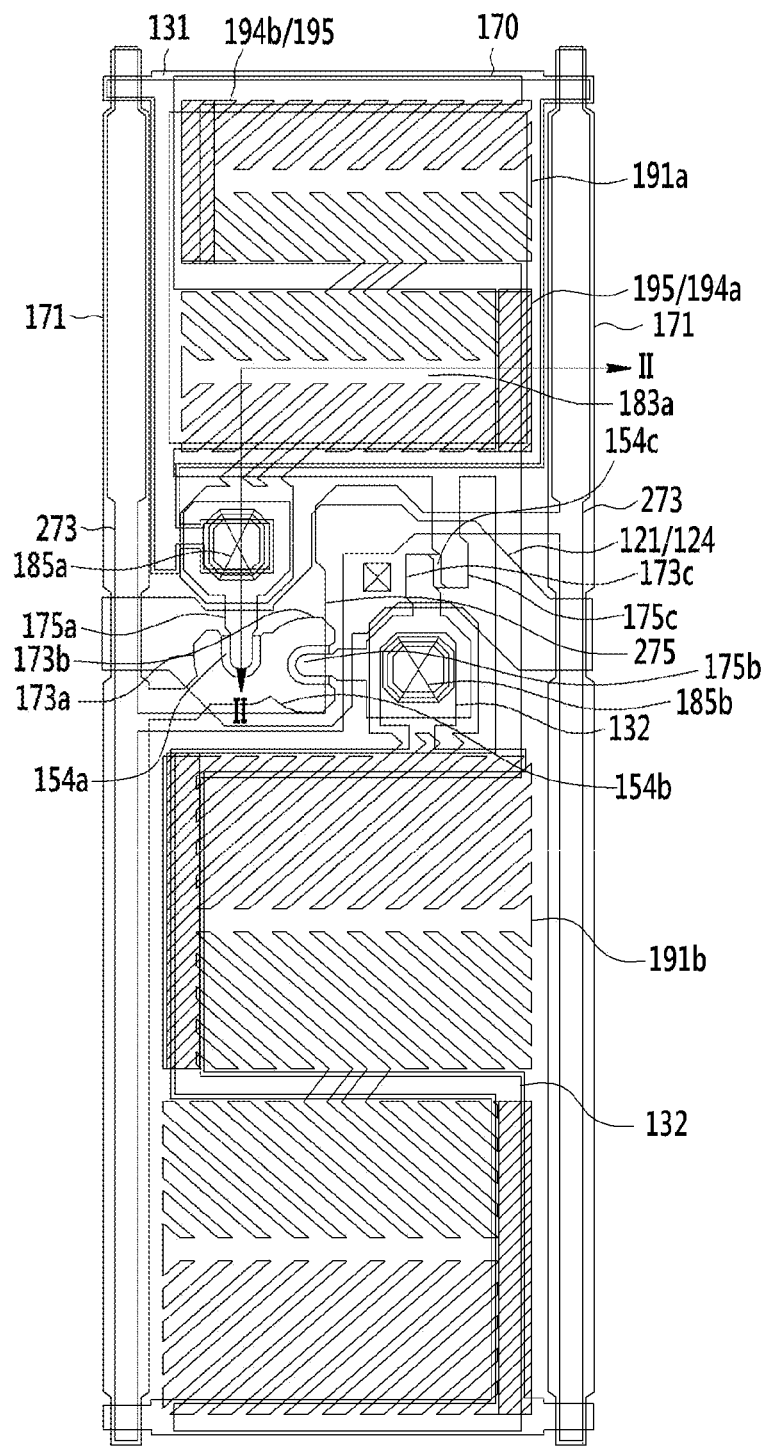
FIG. 1 is a layout view of a thin film transistor array panel according to an embodiment.

The inventive concept will be described more fully herein with reference to the accompanying drawings, in which exemplary embodiments are shown. As those skilled in the art would realize, the embodiments may be modified in various ways without departing from the spirit or scope of the inventive concept.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be disposed directly on the other element, or with one or more intervening elements being present.

In contrast, when an element is referred to as being "directly on" another element, there are no intervening elements present.

First, a thin film transistor array panel according to an embodiment will be described in detail with reference to FIGS. 1, 2, 3, and 4.

Figure 2:
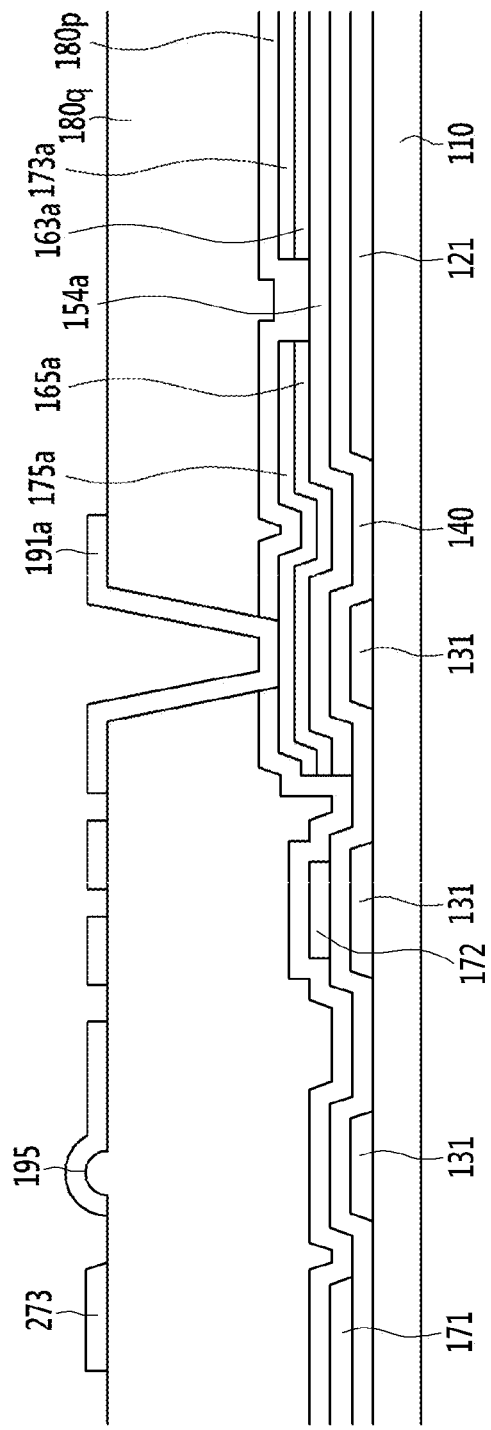
FIG. 2 is a cross-sectional view of the thin film transistor array panel of FIG. 1 taken along line II-II.
Figure 3:
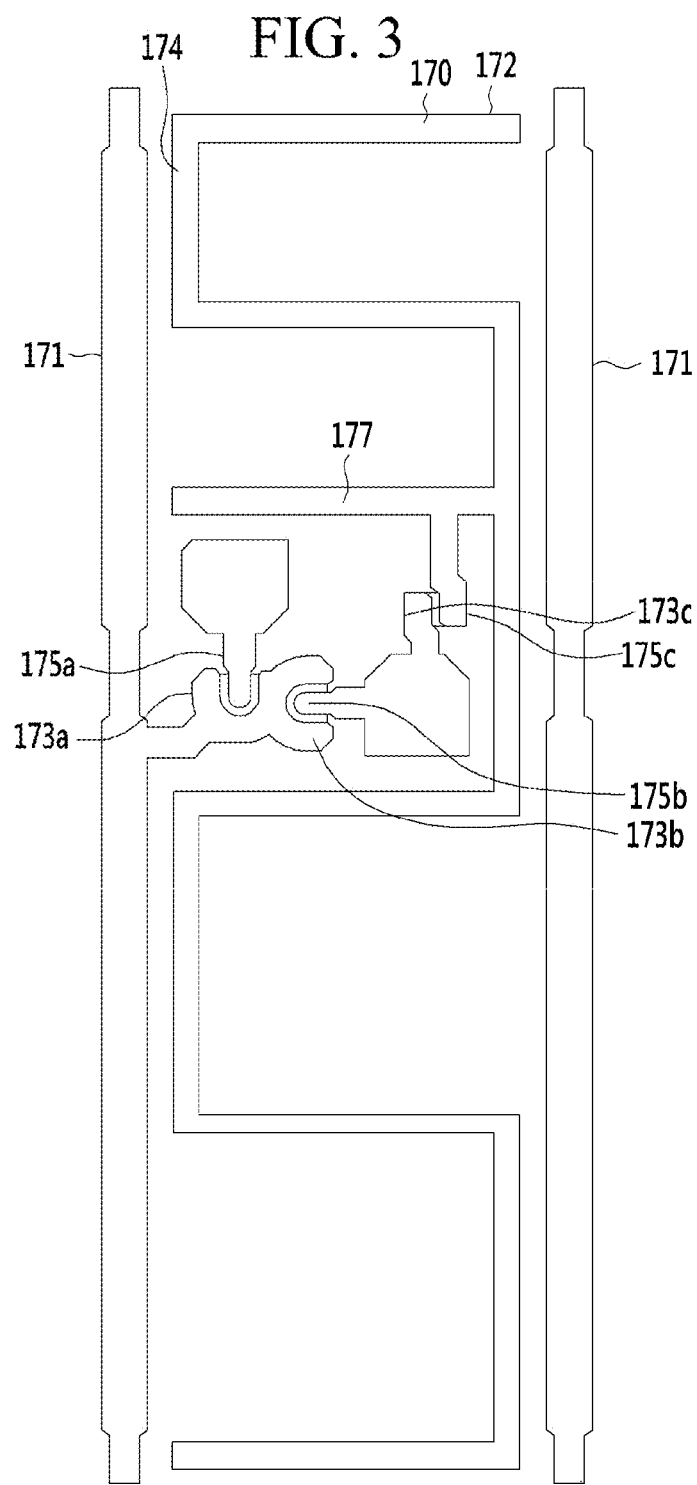
FIG. 3 illustrates a data line and a divided reference voltage line of the thin film transistor display panel of FIG. 1.
Figure 4:
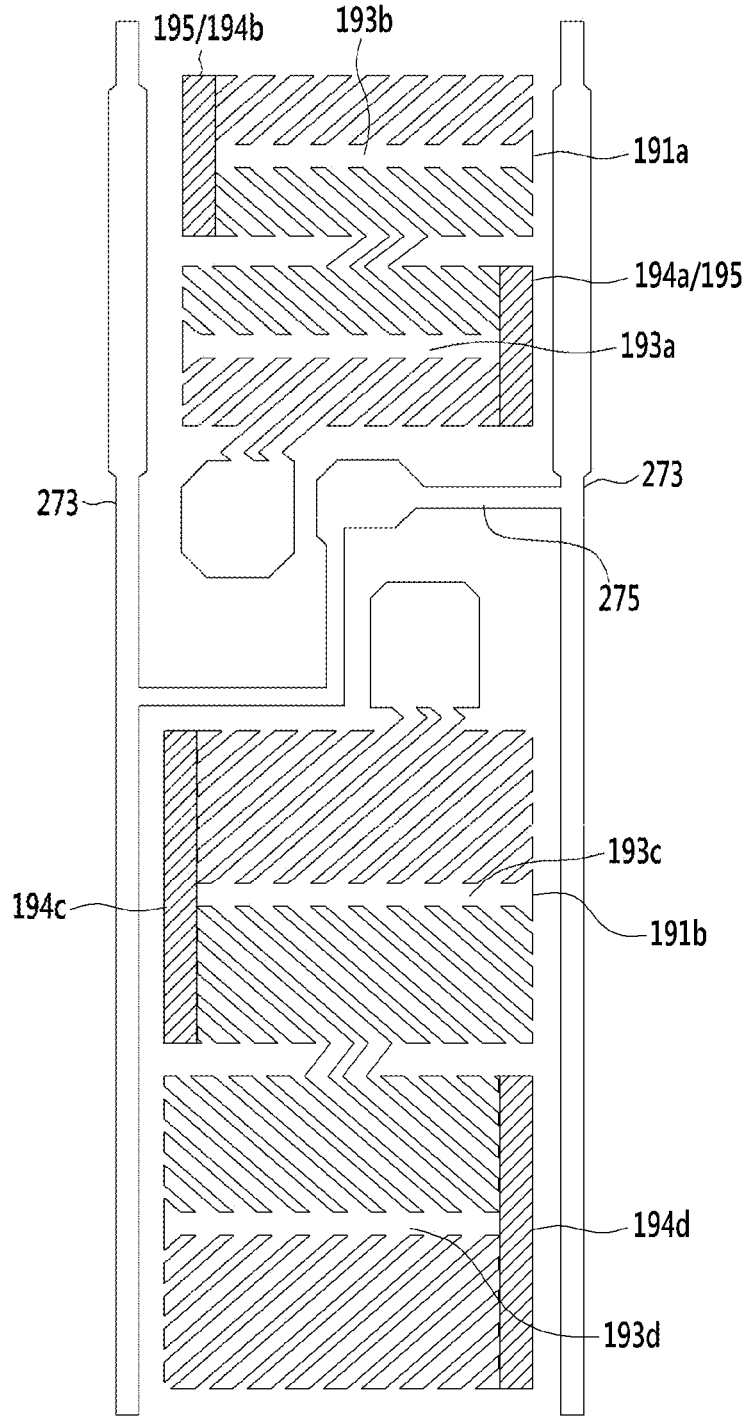
FIG. 4 illustrates a pixel electrode and a shielding electrode of the thin film transistor display panel of FIG. 1.

FIG. 1 is a layout view of the exemplary thin film transistor array panel. FIG. 2 is a cross-sectional view of the thin film transistor array panel of FIG. 1 taken along line II-II. FIG. 3 illustrates a data line and a divided reference voltage line of the thin film transistor array panel of FIG. 1. FIG. 4 illustrates a pixel electrode and a shielding electrode of the thin film transistor array panel of FIG. 11.

Referring to FIGS. 1 and 2, a gate conductor is disposed on a first substrate 110. The gate conductor includes a gate line 121 and storage electrode lines 131 and 132. The first substrate 110 may be made of transparent glass or plastic.

The gate line 121 includes a wide end portion (not shown) formed in contact with a gate electrode, another layer, or an external driving circuit. The gate line 121 may be made of an aluminum-based metal (such as aluminum (Al) or an aluminum alloy), a silver-based metal (such as silver (Ag) or a silver alloy), a copper-based metal (such as copper (Cu) or a copper alloy), a molybdenum-based metal (such as molybdenum (Mo) or a molybdenum alloy), chromium (Cr), tantalum (Ta), and/or titanium (Ti). In some embodiments, the gate line 121 may have a multilayered structure including at least two conductive layers having different physical properties.

The gate line 121 is disposed crossing a pixel area horizontally. An upper portion of the gate line 121 constitutes a first subpixel area for displaying a high gray, and a lower portion of the gate line 121 constitutes a second subpixel area for displaying a low gray.

The storage electrode lines 131 and 132 may be made of the same material as the gate line 121, and may be formed simultaneously with the gate line 121.

The storage electrode line 131 in the upper portion of the gate line 121 may be formed having a quadrangle shape so as to surround the first subpixel area. The uppermost side of the quadrangle-shaped storage electrode line 131 may extend horizontally from the pixel area and connect with another layer or an external driving circuit.

The storage electrode line 132 in the lower portion of the gate line 121 may be formed in a shape similar to the number "5" in the second subpixel area. The storage electrode line 132 includes a plurality of horizontal portions and a plurality of vertical portions connecting the horizontal portions. In some cases, the vertical portions may connect to only one end of each horizontal portion. For example, in some embodiments, when a first horizontal portion and a second horizontal portion are connected on their left ends by a first vertical portion, the second horizontal portion and a third horizontal portion may be connected on their right ends by a second vertical portion. The third horizontal portion of the storage electrode line 132 may extend horizontally from the pixel area and connect with another layer or an external driving circuit. In some embodiments, the third horizontal portion of the storage electrode line 132 in a first pixel area is the same as the upper end horizontal portion of the storage electrode line 131 of a second pixel area disposed below the first pixel area. That is, a single horizontal portion may extend horizontally from one pixel area and connect with another layer or an external driving circuit.

A gate insulating layer 140 is formed on the gate conductor. A first semiconductor 154a, a second semiconductor 154b, and a third semiconductor 154c are formed on the gate insulating layer 140. A plurality of ohmic contacts 163a, 165a, 163b, 165b, 163c, and 165c are formed on the semiconductors 154a, 154b, and 154c. A data conductor is formed on the ohmic contacts 163a, 165a, 163b, 165b, 163c, and 165c and the gate insulating layer 140. The data conductor includes a data line 171 and a divided reference voltage line 170. In some embodiments, the data conductor, the semiconductor positioned below the data conductor, and the corresponding ohmic contact may be simultaneously formed using one mask.

Next, the data conductor of the exemplary thin film transistor array panel will be described in detail with reference to FIG. 3.

Referring to FIG. 3, the data conductor includes the data line 171, a first drain electrode 175a, a second drain electrode 175b, and the divided reference voltage line 170. The data line 171 extends vertically along the pixel area, and includes a first source electrode 173a and a second source electrode 173b. The divided reference voltage line 170 includes a third drain electrode 175c.

The divided reference voltage line 170 includes a plurality of horizontal portions and a plurality of vertical portions connecting the horizontal portions. The divided reference voltage line 170 may be formed in a shape similar to the number "5". In some cases, the vertical portions may connect to only one end of each horizontal portion. For example, in some embodiments, when a first horizontal portion and a second horizontal portion are connected on their left ends by a first vertical portion, the second horizontal portion and a third horizontal portion may be connected on their right ends by a second vertical portion.

The divided reference voltage line 170 may be formed in a shape similar to the number "5" in each of the first subpixel area and the second subpixel area. When the length of the second subpixel area is greater than the length of the first subpixel area, the length of the divided reference voltage line 170 in the second subpixel area is also increased.

It should be noted that the shape of the divided reference voltage line 170 may be horizontally inverted according to a direction of a pixel electrode. That is, the divided reference voltage line 170 may have a shape similar to a horizontally inverted number "5" in the first and second subpixel areas.

In the divided reference voltage line 170 disposed in the first subpixel area, a section of a lowermost horizontal portion 177 is divided in a downward direction to form the third drain electrode 175c.

A gate electrode 124, the first source electrode 173a, the first drain electrode 175a, and the first semiconductor island 154a collectively constitute a first thin film transistor (TFT) Qa, with a channel of the first thin film transistor Qa being formed in the semiconductor 154a between the first source electrode 173a and the first drain electrode 175a. Similarly, the gate electrode 124, the second source electrode 173b, the second drain electrode 175b, and the second semiconductor island 154b collectively constitute a second thin film transistor Qb, with a channel of the second thin film transistor Qb being formed in the semiconductor 154b between the second source electrode 173b and the second drain electrode 175b. Likewise, the gate electrode 124, a third source electrode 173c, the third drain electrode 175c, and the third semiconductor island 154c collectively constitute a third thin film transistor Qc, with a channel of the third thin film transistor Qc being formed in the semiconductor 154c between the third source electrode 173c and the third drain electrode 175c.

The second drain electrode 175b is connected with the third source electrode 173c, and includes a widened portion.

A first passivation layer 180p is formed on the data conductor and the exposed portions of the semiconductors 154a, 154b, and 154c. The first passivation layer 180p may include an inorganic insulating layer such as a silicon nitride or a silicon oxide.

A second passivation layer 180q is disposed on the first passivation layer 180p. The second passivation layer 180q may be a color filter capable of displaying one of primary colors (such as the three primary colors red, green, and blue), as well as other colors such as yellow, cyan, or magenta. In some embodiments, the color filter may be capable of displaying a mixture of the primary colors, or white in addition to the primary colors. Also, when the second passivation layer 180q is a color filter, the first passivation layer 180p may prevent a pigment of the color filter from flowing into the exposed portions of the semiconductors 154a, 154b, and 154c.

In some alternative embodiments, the second passivation layer 180q may be omitted. In those embodiments, the first passivation layer 180p may serve as a color filter.

A first contact hole 185a and a second contact hole 185b are formed in the first passivation layer 180p and the second passivation layer 180q, respectively. The first contact hole 185a exposes the first drain electrode 175a, and the second contact hole 185b exposes the second drain electrode 175b.

A plurality of pixel electrodes 191 are formed on the second passivation layer 180q. Each pixel electrode 191 is divided into a first subpixel electrode 191a and a second subpixel electrode 191b neighboring each other in a column direction, with the gate line 121 interposed therebetween. The pixel electrode 191 may be made of a transparent conductive material (such ITO or IZO) or a reflective metal (such as aluminum, silver, chromium, or an alloy thereof).

A shielding electrode 273 may be formed in the same layer as the pixel electrode 191 on the second passivation layer 180q. The shielding electrode 273 may be made of the same material as the pixel electrode 191. The pixel electrode 191 and the shielding electrode 273 may be simultaneously formed through a same process.

Next, the shape of the pixel electrode 191 and the shielding electrode 273 will be described with reference to FIG. 4.

First, the shielding electrode 273 will be described. The shielding electrode 273 includes a vertical portion overlapping an edge of the data line 171 of a pixel area, and one or more horizontal portions 275 connecting neighboring vertical portions. The horizontal portion 275 of the shielding electrode 273 may have a wider portion in the middle thereof.

A voltage applied to a common electrode (not shown) is applied to the shielding electrode 273. Thus, an electric field is not generated between the shielding electrode 273 and the common electrode such that a liquid crystal layer disposed therebetween is not aligned. Accordingly, the liquid crystal between the shielding electrode 273 and the common electrode displays a black color. When the liquid crystal displays a black color, the liquid crystal itself may serve as a black matrix. Thus, a conventional black matrix (typically provided in an upper panel) may be omitted in a liquid crystal display including the exemplary thin film transistor array panel, since the liquid crystal between the shielding electrode 273 and the common electrode may serve as the black matrix.

Next, the pixel electrode 191 will be described. The pixel electrode 191 is divided into the first subpixel electrode 191a and the second subpixel electrode 191b neighboring each other in a column direction, with the gate line 121 disposed therebetween. The gate line 121 may be centered between the first subpixel electrode 191a and the second subpixel electrode 191b.

The first subpixel electrode 191a includes horizontal stems 193a and 193b extending in a horizontal direction and a plurality of minute branches extending in a diagonal direction at lateral sides of the horizontal stems 193a and 193b. The plurality of minute branches may extend in different diagonal directions from the horizontal stems 193a and 193b.

The first horizontal stem 193a includes a first vertical stem 194a crossing the first horizontal stem 193a perpendicularly at a right side of the first horizontal stem 193a, and minute branches extending obliquely from the first horizontal stem 193a in a direction away from the first vertical stem 194a.

The second horizontal stem 193b includes a second vertical stem 194b crossing the second horizontal stem 193b perpendicularly at a left side of the second horizontal stem 193b, and minute branches extending obliquely from the second horizontal stem 193b in a direction away from the second vertical stem 194b.

However, it should be noted that the directions listed above are merely exemplary, and that the first horizontal stem 193a and the second horizontal stem 193b may be formed in different configurations. For example, in some embodiments, the first vertical stem 194a may cross the first horizontal stem 193a at the left side of the first horizontal stem 193a, and the second vertical stem 194b may cross the second horizontal stem 193b at the right side of the second horizontal stem 193b.

In some embodiments, some of the minute branches extending from the first horizontal stem 193a are connected with the minute branches extending from the second horizontal stem 193b. In addition, some of the minute branches extending from the first horizontal stem 193a are connected with the widened portion of the first subpixel electrode 191a such that the minute branches receive a voltage from the first drain electrode 175a through the first contact hole 185a.

The second subpixel electrode 191b may have the same shape as the first subpixel electrode 191a. The second subpixel electrode 191b includes two horizontal stems 193c and 193d extending in a horizontal direction, and a plurality of minute branches extending in a diagonal direction at lateral sides of each of the horizontal stems 193c and 193d. The plurality of minute branches may extend in different diagonal directions from the horizontal stems 193c and 193d. Since the horizontal stems 193c and 193d, vertical stems 194c and 194d, and minute branches of the second subpixel electrode 191b are similar to the corresponding elements in the first subpixel electrode 191a, a description of those similar elements need not be provided.

In the first subpixel electrode 191a and the second subpixel electrode 191b of the exemplary thin film transistor array panel, a protrusion 195 is formed in the vertical direction of the vertical stems 194a, 194b, 194c, and 194d such that the first subpixel electrode 191a and the second subpixel electrode 191b protrude upwardly more than other portions of the pixel electrode 191. By forming the protrusion 195 in the vertical direction, most of the area of the vertical stems 194a, 194b, 194c, and 194d in the horizontal or vertical direction is thus disposed higher than other portions of the pixel electrode 191.

Although the vertical stems 194a, 194b, 194c, and 194d protrude in the vertical direction, the middle portion of the vertical stems 194a, 194b, 194c, and 194d is convex and the heights of the vertical stems 194a, 194b, 194c, and 194d gradually decrease toward the edges thereof (when viewed from a horizontal direction). That is, the cross-sections of the vertical stems 194a, 194b, 194c, and 194d may have an arc shape, but need not be limited thereto. In some embodiments, the vertical stems 194a, 194b, 194c, and 194d may have an upward convex bar shape, or any shape that forms a step in the vertical direction of the vertical stems 194a, 194b, 194c, and 194d.

The protrusion 195 of the vertical stems 194a and 194b may be formed in an area corresponding to the vertical stems 194a, 194b, 194c, and 194d of the pixel electrode 191 in the second passivation layer 180q.

In those embodiments in which the second passivation layer 180q is omitted, the protrusion 195 may be formed in the area corresponding to the vertical stems 194a, 194b, 194c, and 194d of the pixel electrode 191 in the first passivation layer 180p.

In those embodiments in which the second passivation layer 180q is a color filter, the protrusion 195 may be formed in an area corresponding to the vertical stems 194a, 194b, 194c, and 194d in an upper surface of the color filter.

When the protrusion 195 is not formed in the vertical stems 194a, 194b, 194c, and 194d, the vertical stems 194a, 194b, 194c, and 194d will have weaker control over the liquid crystal molecules compared to embodiments in which minute branches are formed in various directions to control the liquid crystal molecules. As a result, the liquid crystal is aligned in a perpendicular direction, and a dark portion having deteriorated transmittance may be generated in the liquid crystal display without the protrusion 195.

However, when the protrusion 195 is formed in the vertical stems 194a, 194b, 194c, and 194d, the liquid crystal molecules will not be arranged in the perpendicular direction. Instead, the liquid crystal molecules are inclined toward the protrusion 195 due to a fringe field formed between the protrusion 195 and a common electrode (not shown). Accordingly, a dark portion having deteriorated transmittance will not be generated in a liquid crystal display including the exemplary thin film transistor array panel.

Next, the divided reference voltage line 170 will be described.

In the first subpixel area, areas where the horizontal portion and the vertical portion of the divided reference voltage line 170 correspond to an area where the minute branches, are formed in the pixel electrode 191.

A first horizontal portion 172 of the divided reference voltage line 170 is located at an edge of the minute branch. Specifically, the first horizontal portion 172 is located at the upper end of the divided reference voltage line 170 and extends from right to left.

A second vertical portion 174 is connected with the first horizontal portion 172 of the divided reference voltage line 170 and located at the left side of the first horizontal portion 172 so as to overlap the second vertical stem 194b of the first subpixel electrode 191a.

A second horizontal portion of the divided reference voltage line 170 is connected with the second vertical portion 174 and extends from left to right. The second horizontal portion of the divided reference voltage line 170 is located between the minute branch extending from the first horizontal stem 193a and the minute branch extending from the second horizontal stem 193b.

A second vertical portion of the divided reference voltage line 170 is connected with the second horizontal portion of the divided reference voltage line 170, is located at the right side of one pixel area, and extends toward the second subpixel area. A third horizontal portion 177, however, extends in the left direction in the middle of the second vertical portion.

The third horizontal portion 177 of the divided reference voltage line 170 is located lower than the minute branch extending from the first horizontal stem 193 of the first subpixel electrode 191a.

In some embodiments, the second subpixel area may have the same area as the first subpixel area.

The first subpixel electrode 191a and the second subpixel electrode 191b are physically and electrically connected with the first drain electrode 175a and the second drain electrode 175b through the first contact hole 185a and the second contact hole 185b, and configured to receive a data voltage from the first drain electrode 175a and the second drain electrode 175b, respectively. In the above embodiment, the data voltage applied to the second drain electrode 175b is divided by the third source electrode 173c such that the voltage applied to the first subpixel electrode 191a is higher than the voltage applied to the second subpixel electrode 191b.

Next, a liquid crystal display including the exemplary thin film transistor array panel will be described in detail with reference to FIG. 5.

Figure 5:
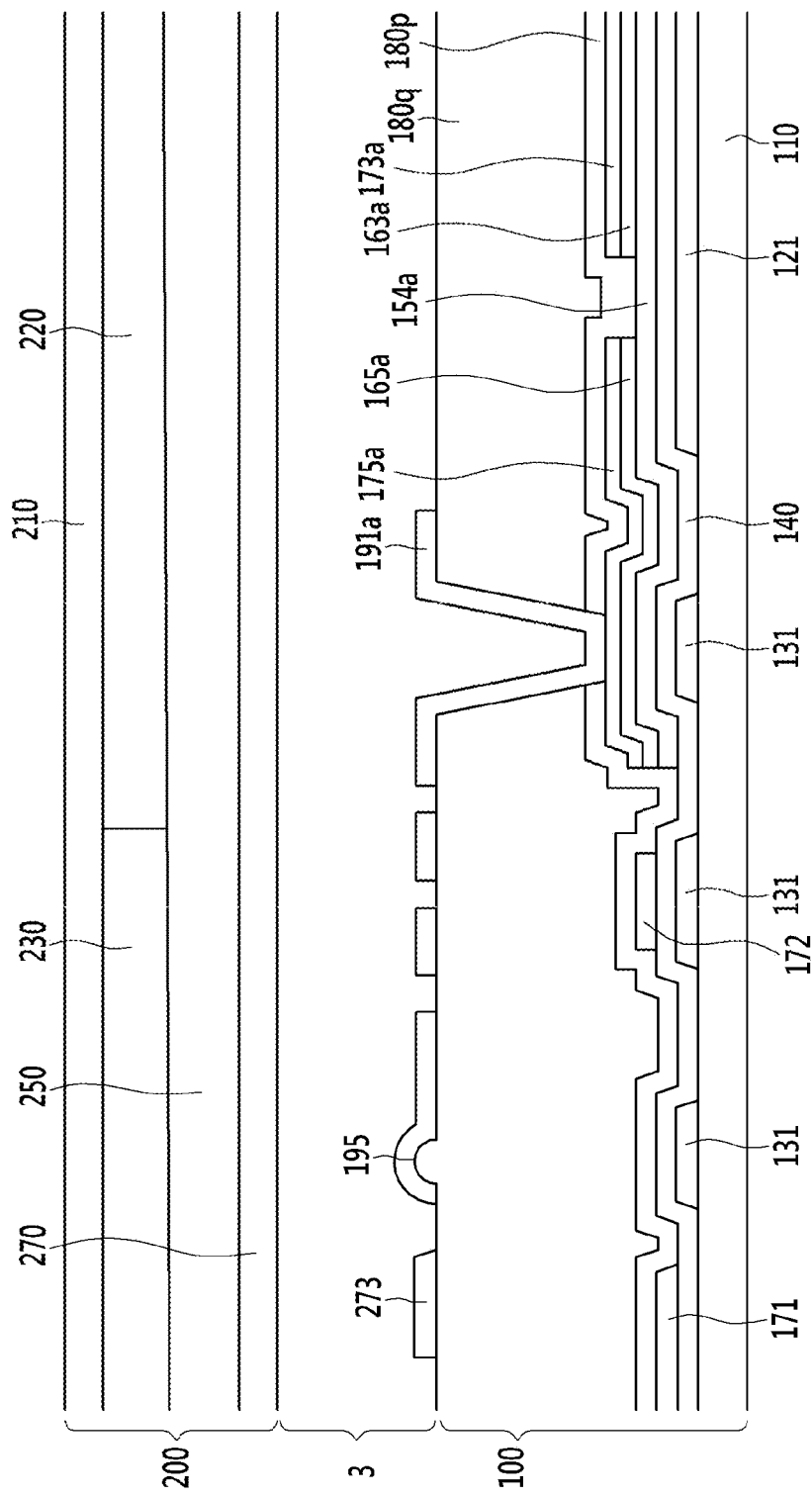
FIG. 5 is a cross-sectional view of a liquid crystal display including the thin film transistor array panel of FIG. 1.

FIG. 5 is a cross-sectional view of the liquid crystal display including the thin film transistor array panel of FIGS. 1 and 2.

Referring to FIG. 5, a lower panel 100 of the liquid crystal display has the same structure as the thin film transistor array panel of FIGS. 1 and 2. Accordingly, a repeat description of the same constituent elements will be omitted.

Next, an upper panel 200 of the liquid crystal display will be described.

The upper panel 200 includes a light blocking member 220 disposed on a second substrate 210. The second substrate 210 may be made of transparent glass or plastic. The light blocking member 220 prevents light leakage, and is also referred to as a black matrix.

A plurality of color filters 230 are formed on the substrate 210. In those embodiments in which the second passivation layer 180q of the lower panel 100 is a color filter, the color filters 230 of the upper panel 200 may be omitted. In some alternative embodiments, the light blocking member 220 of the upper panel 200 may be formed in the lower panel 100.

An overcoat 250 is formed on the color filter 230 and the light blocking member 220, and a common electrode 270 is formed on the overcoat 250. The overcoat 250 may be made of an (organic) insulation material. The overcoat 250 prevents the color filters 230 from being exposed and also provides a flat surface. In some particular embodiments, the overcoat 250 may be omitted.

A liquid crystal layer 3 is disposed between the lower panel 100 and the upper panel 200. The liquid crystal layer 3 has negative dielectric anisotropy, and liquid crystal molecules of the liquid crystal layer 3 are aligned such that the long axes of the liquid crystal molecules are perpendicular to the surfaces of the two panels 100 and 200 in the absence of an electric field.

An electric field is generated by applying a data voltage to the first subpixel electrode 191a and the second subpixel electrode 191b and a voltage to the common electrode 270 of the upper panel 200. The electric field determines a direction of the liquid crystal molecules of the liquid crystal layer 3 between the two electrodes 191 and 270. Luminance of light passing through the liquid crystal layer 3 is changed depending on the alignment direction of the liquid crystal molecules.

Next, the layout of the signal lines and pixels of the liquid crystal display and a method of driving the liquid crystal display according to an embodiment will be described.

Figure 6:
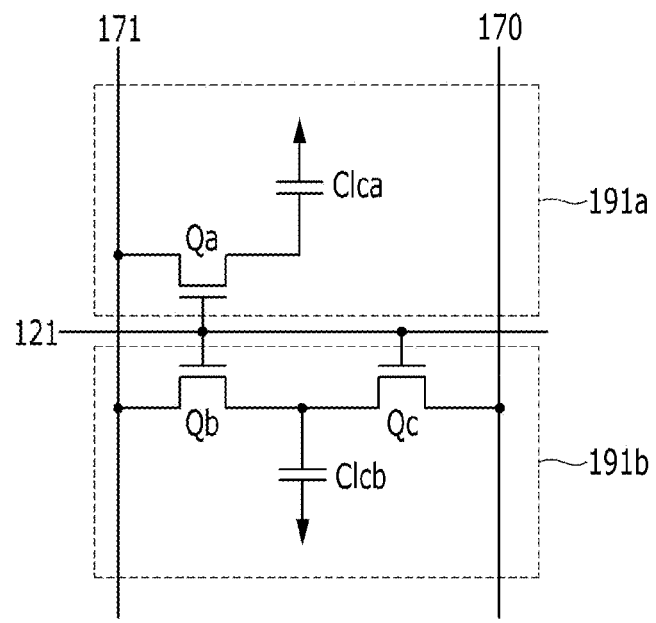
FIG. 6 is an equivalent circuit diagram of a pixel in the liquid crystal display of FIG. 5.

FIG. 6 is an equivalent circuit diagram of a pixel of a liquid crystal display according to an embodiment.

Referring to FIG. 6, a pixel PX of the liquid crystal display includes a plurality of signal lines. The signal lines include a gate line 121 configured to transmit a gate signal, a data line 171 configured to transmit a data signal, and a plurality of divided reference voltage lines 170 configured to transmit a divided reference voltage. The pixel PX further includes first, second, and third switching elements Qa, Qb, and Qc connected to the plurality of signal lines, and first and second liquid crystal capacitors Clca and Clcb.

Each of the first and second switching elements Qa and Qb is connected with the gate line 121 and the data line 171, and the third switching element Qc is connected with an output terminal of the second switching element Qb and the divided reference voltage line 170.

The first switching element Qa and the second switching element Qb are three-terminal elements (such as a thin film transistor). Control terminals of the first switching element Qa and the second switching element Qb are connected with the gate line 121, and input terminals of the first switching element Qa and the second switching element Qb are connected with the data line 171. An output terminal of the first switching element Qa is connected with the first liquid crystal capacitor Clca, an output terminal of the second switching element Qb is connected with the second liquid crystal capacitor Clcb, and an output terminal of the third switching element Qc is connected with the second storage capacitor Clcb and an input terminal of the third switching element Qc.

The third switching element Qc is also a three-terminal element (such as a thin film transistor). A control terminal of the third switching element Qc is connected with the gate line 121, an input terminal of the third switching element Qc is connected with the second liquid crystal capacitor Clcb, and an output terminal of the third switching element Qc is connected with the divided reference voltage line 170.

When a gate-on signal is applied to the gate line 121, the first switching element Qa, the second switching element Qb, and the third switching element Qc connected thereto are turned on. Thus, a data voltage applied to the data line 171 is applied to the first and second subpixel electrodes 191a and 191b through the turned-on first and second switching elements Qa and Qb, respectively. In the above embodiment, the data voltage applied to the first subpixel electrode191a and the data voltage applied to the second subpixel electrode191b are equal to each other, and the first liquid crystal capacitor Clca and the second liquid crystal capacitor Clcb are charged by a value that is equal to a difference between the common voltage and the data voltage. At the same time, the voltage in the second liquid crystal capacitor Clcb is divided by the turned-on third switching element Qc. Thus, the voltage in the second liquid crystal capacitor Clcb decreases as a result of the difference between the common voltage and the divided reference voltage. That is, the voltage in the first liquid crystal capacitor Clca becomes higher than the voltage in the second liquid crystal capacitor Clcb.

As described above, the voltage in the first liquid crystal capacitor Clca and the voltage in the second liquid crystal capacitor Clcb are different from each other. Since the voltage of the first liquid crystal capacitor Clca and the voltage of the second liquid crystal capacitor Clcb are different from each other, an inclination angle of the first subpixel and an inclination angle of the second subpixel will be different from each other, and accordingly, the luminance of the two subpixels (subpixel electrodes 191a and 191b) will be different from each other. Accordingly, by controlling the voltage of the first liquid crystal capacitor Clca and the voltage of the second liquid crystal capacitor Clcb, an image viewed from the side of the screen may be approximately the same as an image viewed from the front of the screen. In other words, side visibility is improved in the above embodiment.

In the above embodiment, the third switching element Qc is connected to the second liquid crystal capacitor Clcb and the divided reference voltage line 170 is included so as to vary the voltage in the first liquid crystal capacitor Clca and the voltage in the second liquid crystal capacitor Clcb. In a liquid crystal display according to another embodiment, the second liquid crystal capacitor Clcb may be connected to a step-down capacitor. In detail, the third switching element includes a first terminal connected to a step-down gate line, a second terminal connected to the second liquid crystal capacitor Clcb, and a third terminal connected to the step-down capacitor. As a result, some of the charge amount (stored in the second liquid crystal capacitor Clcb) is charged in the step-down capacitor, thereby setting different voltages between the first liquid crystal capacitor Clcb and the second liquid crystal capacitor Clcb.

Further, in a liquid crystal display according to another embodiment, the first liquid crystal capacitor Clcb and the second liquid crystal capacitor Clcb are connected to different data lines and receive different data voltages. As a result, the voltages between the first liquid crystal capacitor Clcb and the second liquid crystal capacitor Clcb may be set differently. It is noted that the voltages between the first liquid crystal capacitor Clcb and the second liquid crystal capacitor Clcb may also be set differently using other methods.

Next, a method of manufacturing a thin film transistor array panel according to an embodiment will be described with reference to FIGS. 7, 8, 9, 10, and 11.

FIGS. 7, 8, 9, 10, and 11 illustrate the thin film transistor array panel at different stages of manufacture.

Figure 7:
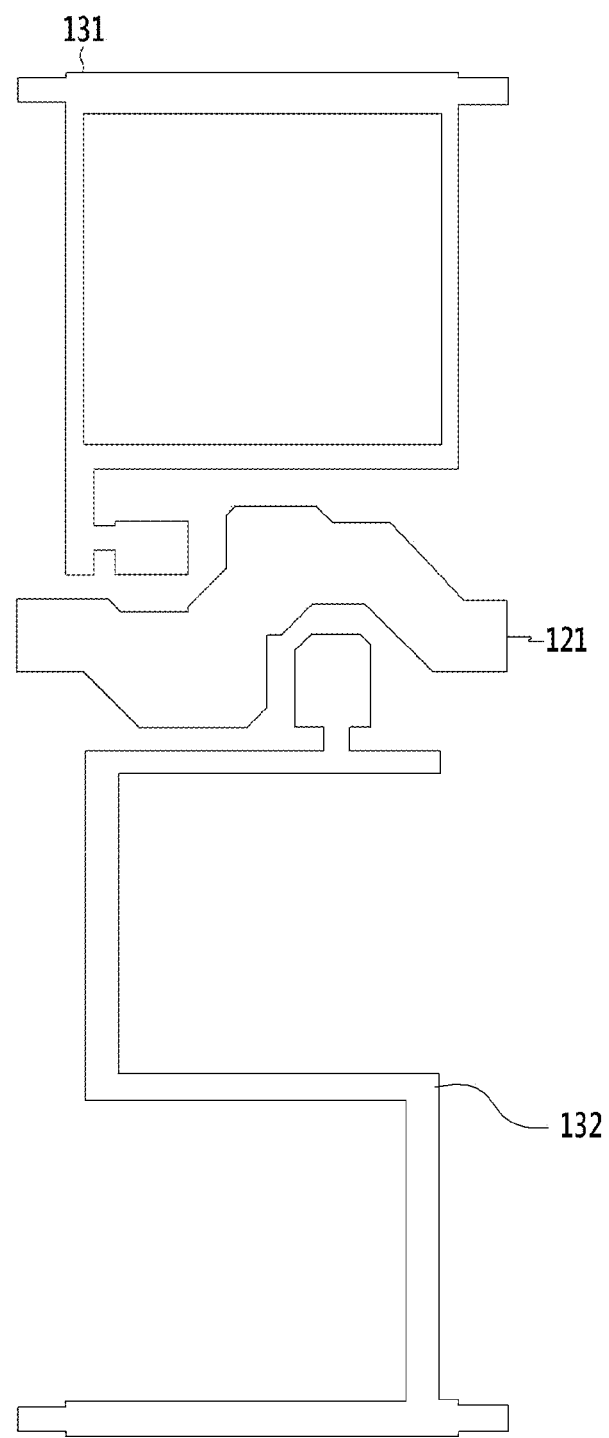
FIGS. 7, 8, 9, 10, and 11 illustrate the thin film transistor array panel of FIG. 2 at different stages of manufacture according to an exemplary method of manufacturing the thin film transistor array panel.
Figure 8:
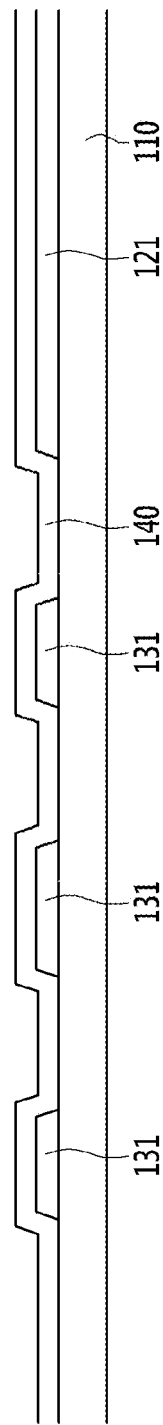

First, as shown in FIGS. 7 and 8, a gate conductor is formed on a first substrate 110. The gate conductor includes a gate line 121 and storage electrode lines 131 and 132. The first substrate 110 may be made of transparent glass or plastic.

The gate line 121 is disposed crossing a pixel area horizontally. The storage electrode lines 131 and 132 may be made of the same material as the gate line 121, and may be simultaneously formed with the gate line 121.

The storage electrode line 131 in the upper portion of the gate line 121 may be formed having a quadrangle shape so as to surround a first subpixel area. The uppermost side of the quadrangle-shaped storage electrode line 131 may extend horizontally from the pixel area and connect with another layer or an external driving circuit.

The storage electrode line 132 in the lower portion of the gate line 121 may be formed in a shape similar to the number "5" in a second subpixel area. The storage electrode line 132 includes a plurality of horizontal portions and a plurality of vertical portions connecting the horizontal portions. In some cases, the vertical portions may connect to only one end of each horizontal portion. For example, in some embodiments, when a first horizontal portion and a second horizontal portion are connected on their left ends by a first vertical portion, the second horizontal portion and a third horizontal portion may be connected on their right ends by a second vertical portion.

Next, as shown in FIG. 8, a gate insulating layer 140 is formed on the gate conductor (i.e., the gate insulating layer 140 is formed on the gate line 121 and the storage electrode lines 131 and 132).

Figure 9:
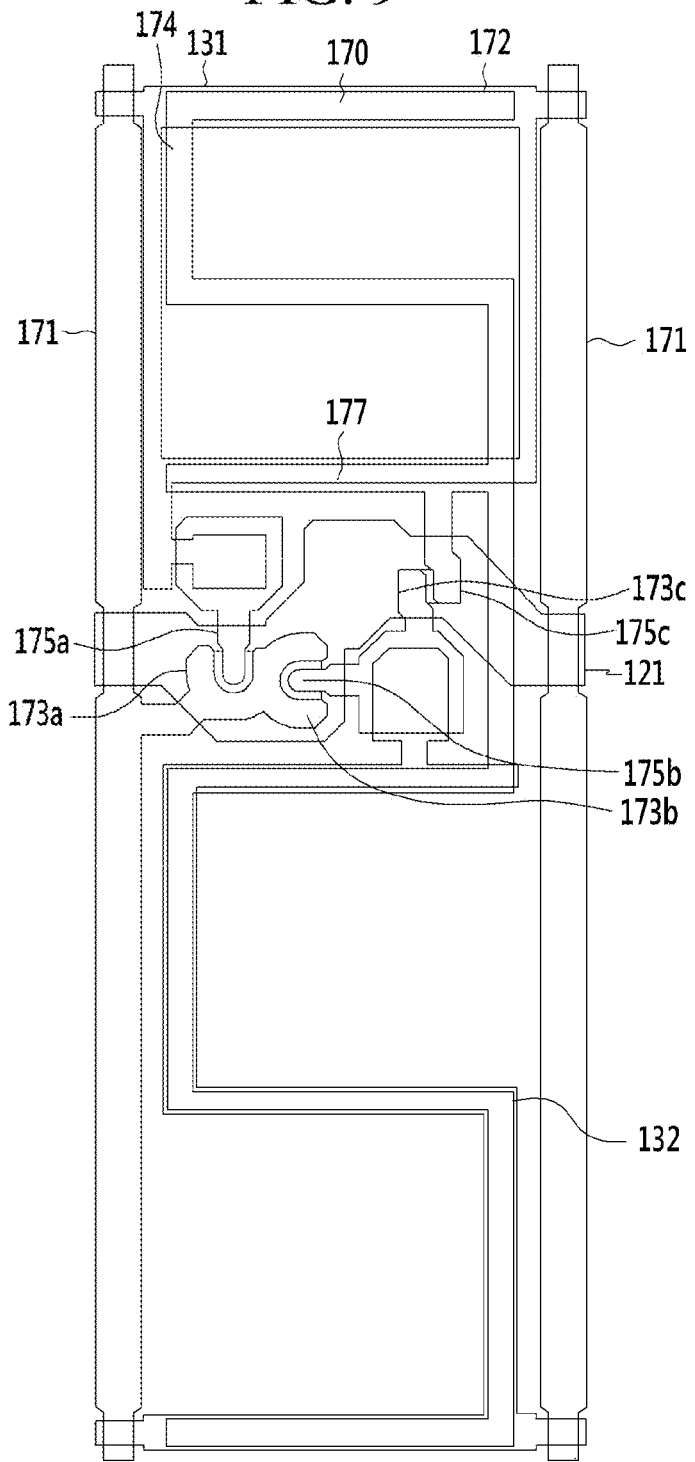
Figure 10:
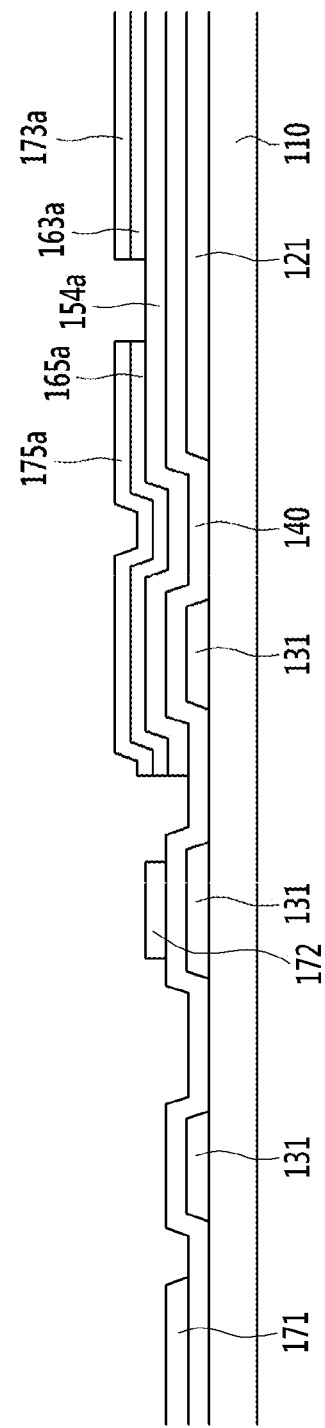

Next, a data conductor is formed, as shown in FIGS. 9 and 10. A semiconductor and an ohmic contact are formed below the data conductor, and the semiconductor and the ohmic contact may be simultaneously formed using one mask.

The data conductor includes a data line 171, a first drain electrode 175a, a second drain electrode 175b, and a divided reference voltage line 170.

The data line 171 extends vertically along a pixel area, and includes a first source electrode 173a and a second source electrode 173b.

In addition, the data line 171 includes the divided reference voltage line 170 extending in a direction parallel to the data line 171. The divided reference voltage line 170 includes a third drain electrode 175c.

The divided reference voltage line 170 includes a plurality of horizontal portions and a plurality of vertical portions connecting the horizontal portions. The divided reference voltage line 170 may be formed in a shape similar to the number "5". In some cases, the vertical portions may connect to only one end of each horizontal portion. For example, in some embodiments, when a first horizontal portion and a second horizontal portion are connected on their left ends by a first vertical portion, the second horizontal portion and a third horizontal portion may be connected on their right ends by a second vertical portion.

Figure 11:
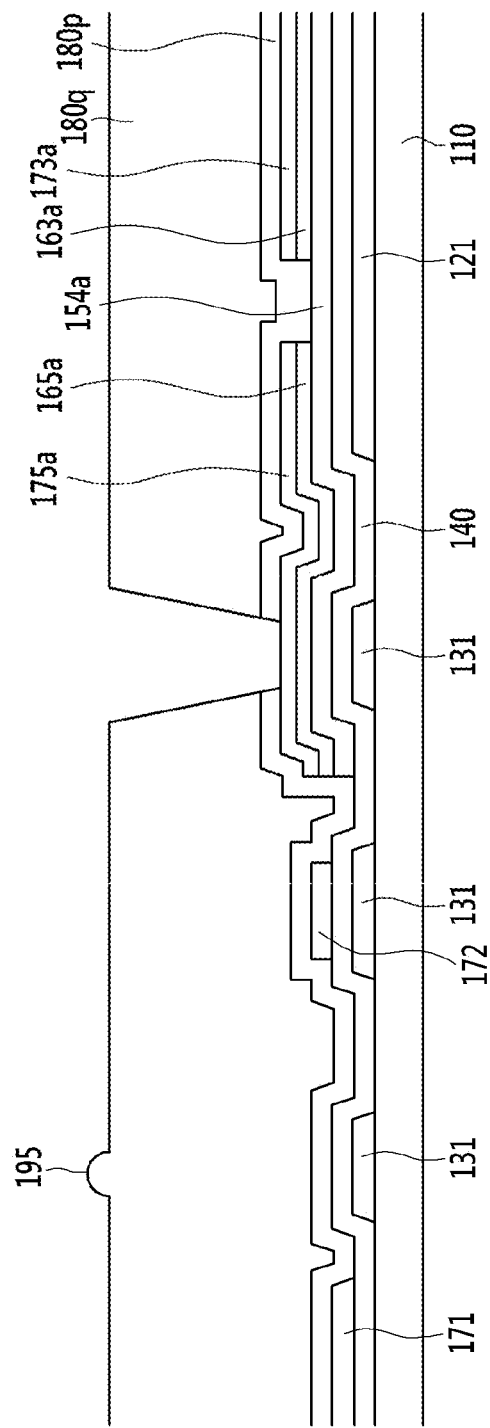

Next, referring to FIG. 11, a first passivation layer 180p and a second passivation layer 180q are sequentially formed on the data conductor and the semiconductor. Contact holes 185a and 185b are then formed in the first passivation layer 180p and the second passivation layer 180q exposing a portion of the first drain electrode 175a and a portion of the second drain electrode 175b, respectively.

In some embodiments, a protrusion 195 is formed in the second passivation layer 180q at a location corresponding to the vertical stems of the pixel electrode 191.

In those embodiments in which the second passivation layer 180q is omitted, the protrusion 195 may be formed in an area corresponding to the vertical stems 194a, 194b, 194c, and 194d of the pixel electrode 191.

In those embodiments in which the second passivation layer 180q is a color filter, the protrusion 195 may be formed in an area corresponding to the vertical stems 194a, 194b, 194c, and 194d in an upper surface of the color filter.

Next, the pixel electrode 191 is formed on the second passivation layer 180q, thereby forming the thin film transistor array panel illustrated in FIGS. 1 and 2. The pixel electrode 191 is connected with the first drain electrode 175a and the second drain electrode 175b through the contact holes 185a and 185b, and receives a current. The pixel electrode 191 includes a first subpixel electrode 191a and a second subpixel electrode 191b neighboring each other in a column direction, with the gate line 121 centered therebetween.

Each of the first and second subpixel electrodes 191a and 191b includes two horizontal stems extending in a horizontal direction and a plurality of minute branches extending in a diagonal direction at lateral sides of each of the horizontal stems. Each of the horizontal stems meets a vertical stem at one side, so as to form vertical branches on respective opposite sides.

In the first subpixel electrode 191a and the second subpixel electrode 191b, a protrusion 195 is formed in the vertical direction of the vertical stems 194a, 194b, 194c, and 194d such that the first subpixel electrode 191a and the second subpixel electrode 191b protrude upwardly more than other portions of the pixel electrode 191.

Although the vertical stems 194a, 194b, 194c, and 194d protrude in the vertical direction, the middle portions of the vertical stems 194a, 194b, 194c, and 194d are convex, and the heights of the middle portions of the vertical stems 194a, 194b, 194c, and 194d gradually decrease toward the edges when viewed from a horizontal direction. That is, cross-sections of the vertical stems 194a, 194b, 194c, and 194d may have an arc shape, but need not be limited thereto. In some embodiments, the vertical stems 194a, 194b, 194c, and 194d may have an upward convex bar shape, or any shape that forms a step in the vertical direction of the vertical stems 194a, 194b, 194c, and 194d.

As described above, the shape of the protrusion 195 where the pixel electrode 191 is formed may be determined according to the shape of the protrusion 195 formed on the second passivation layer 180q.

Figure 12:
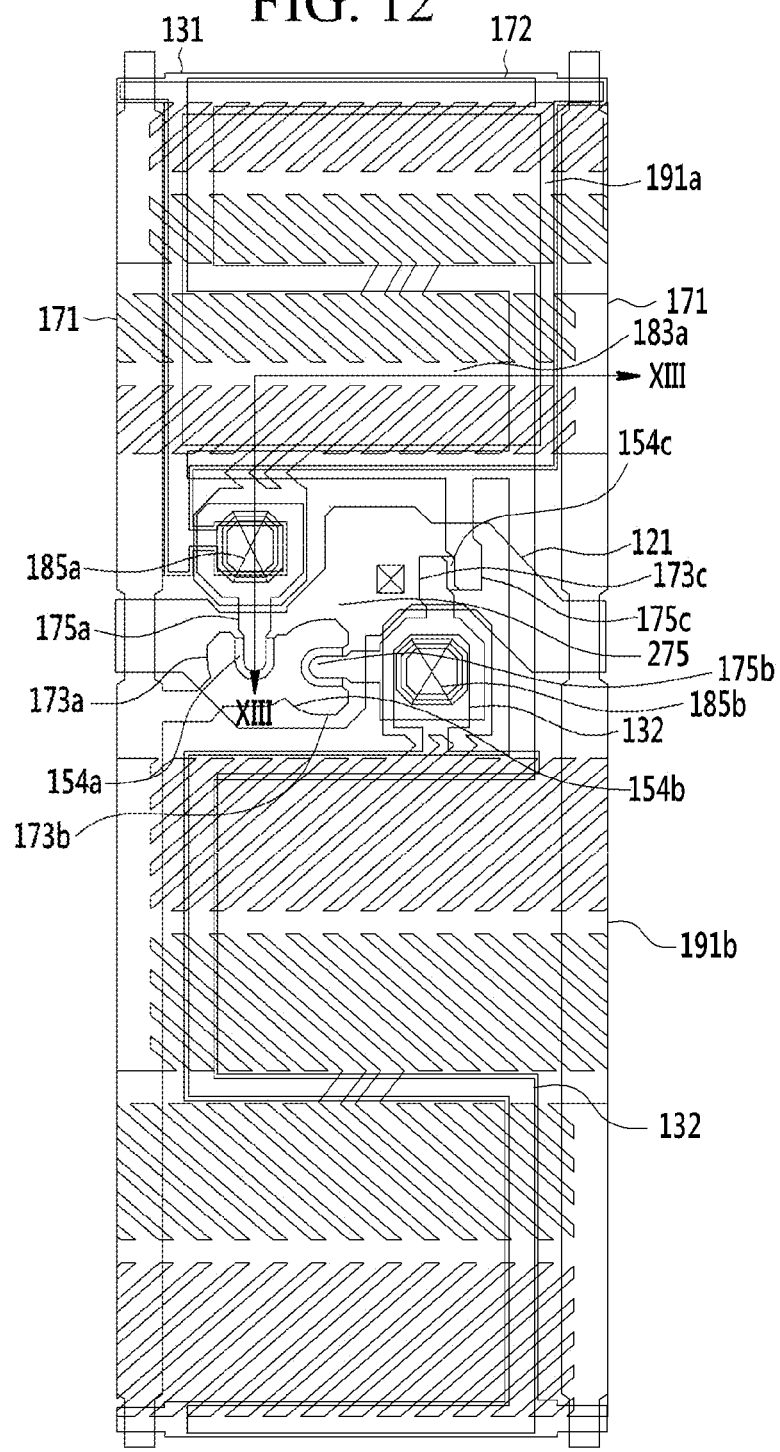
FIG. 12 is a layout view of a thin film transistor array panel according to another embodiment.
Figure 13:
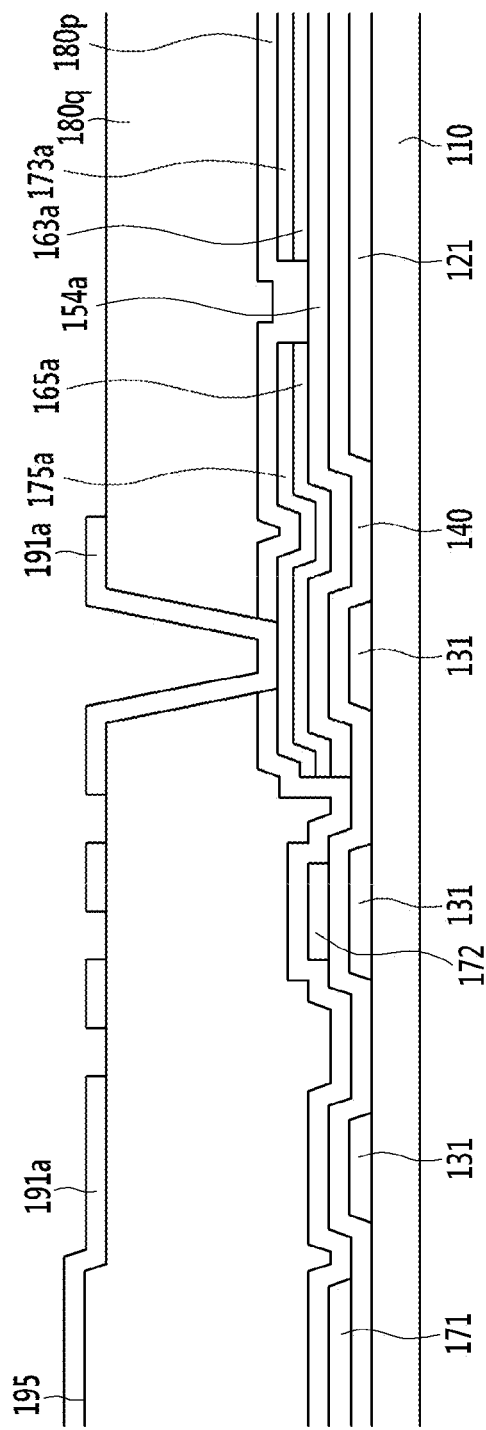
FIG. 13 is a cross-sectional view of the thin film transistor array panel of FIG. 12 taken along line XIII-XIII.

Referring to FIGS. 12 and 13, a thin film transistor array panel according to another embodiment will be described in detail.

FIG. 12 is a layout view of the thin film transistor array panel according to another embodiment, and FIG. 13 is a cross-sectional view of the thin film transistor array panel of FIG. 12 taken along line XIII-XIII.

The embodiment of FIGS. 12 and 13 is similar to the embodiment of FIG. 1 except for the following differences. Specifically, in the embodiment of FIGS. 12 and 13, the shielding electrode 273 is omitted and the pixel electrode 191 has a different area.

In contrast to the embodiment of FIG. 1, the first subpixel electrode 191a and the second subpixel electrode 191b in the thin film transistor array panel of FIGS. 12 and 13 are wider on their left and right sides, such that the left and right areas of the first and second subpixel electrodes 191a and 191b cover the entire data line 171.

Thus, the vertical stems of the first and second subpixel electrodes 191a and 191b overlap areas where the data line 171 is formed. Specifically, the portions of the first and second subpixel electrodes 191a and 191b (that do not overlap with the vertical stems 194a, 194b, 194c, and 194d) overlap with the area where the data line 171 is formed.

By forming a step 196 in an area where the data line 171 is formed and overlapping the left and right edges of the pixel electrode 191 with the area of the data line 171, control over the liquid crystal molecules can be further improved (similar to the effect obtained by using the protrusion 195).

Next, a thin film transistor array panel according to different embodiments will be described with reference to FIGS. 14 and 15.

Figure 14:
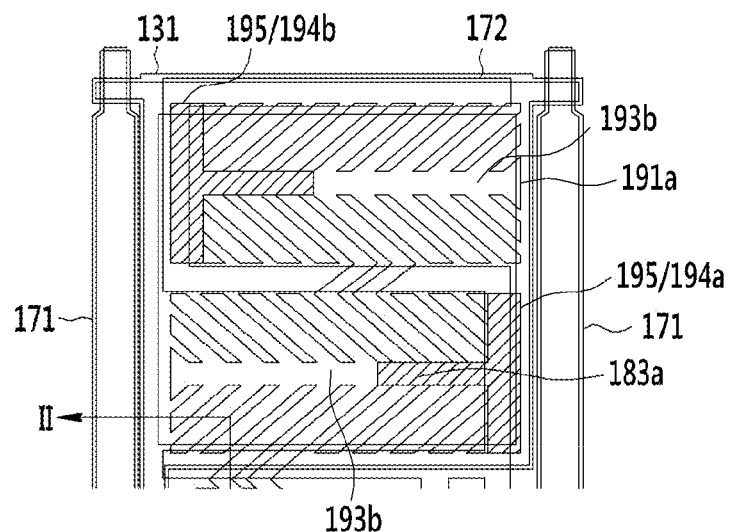
FIG. 14 is a layout view of a thin film transistor array panel according to yet another embodiment.

FIG. 14 is a layout view of a thin film transistor array panel according to yet another embodiment. FIG. 15 is a layout view of a thin film transistor array panel according to a further embodiment.

Figure 15:
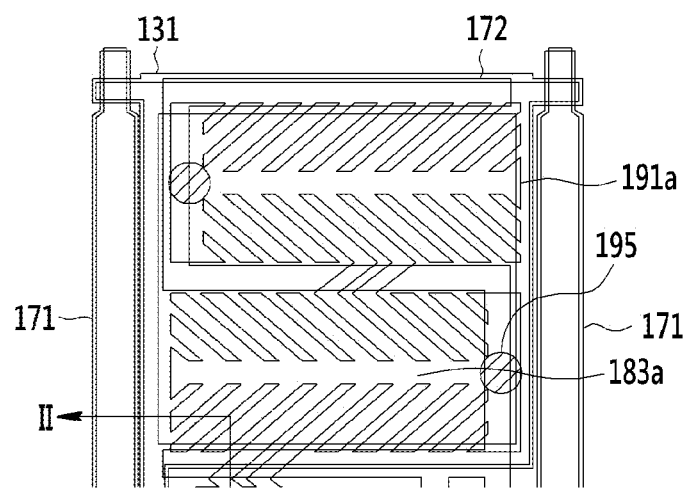
FIG. 15 is a layout view of a thin film transistor array panel according to a further embodiment.

The embodiments of FIGS. 14 and 15 are similar to the embodiment of FIG. 1 except for the following difference. In the embodiments of FIGS. 14 and 15, an area occupied by the protrusion 195 is formed in the pixel electrode 191.

Referring to FIG. 14, the protrusion 195 may be formed in the vertical stems 194a and 194b, and also in portions of the horizontal stems 193a and 193b.

Referring to FIG. 15, the protrusion 195 may be formed only at a point where the vertical stems 194a and 194b and the horizontal stems 193a and 193b of the pixel electrode 191 intersect each other.

Thus, it is noted that the formation of the protrusion 195 is not limited to the previously-described embodiments, and may be modified in various ways so as to control the direction of the liquid crystal molecules.

Figure 16A:
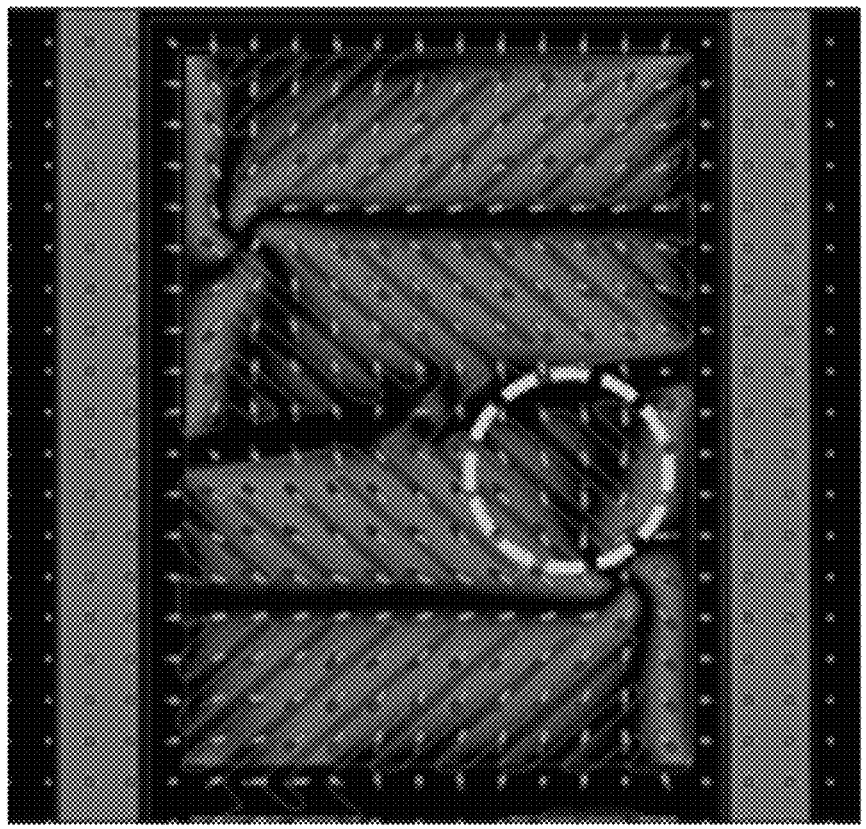
FIG. 16(a) depicts an experimental result illustrating the movement of liquid crystal molecules in a conventional liquid crystal display.
Figure 16B:
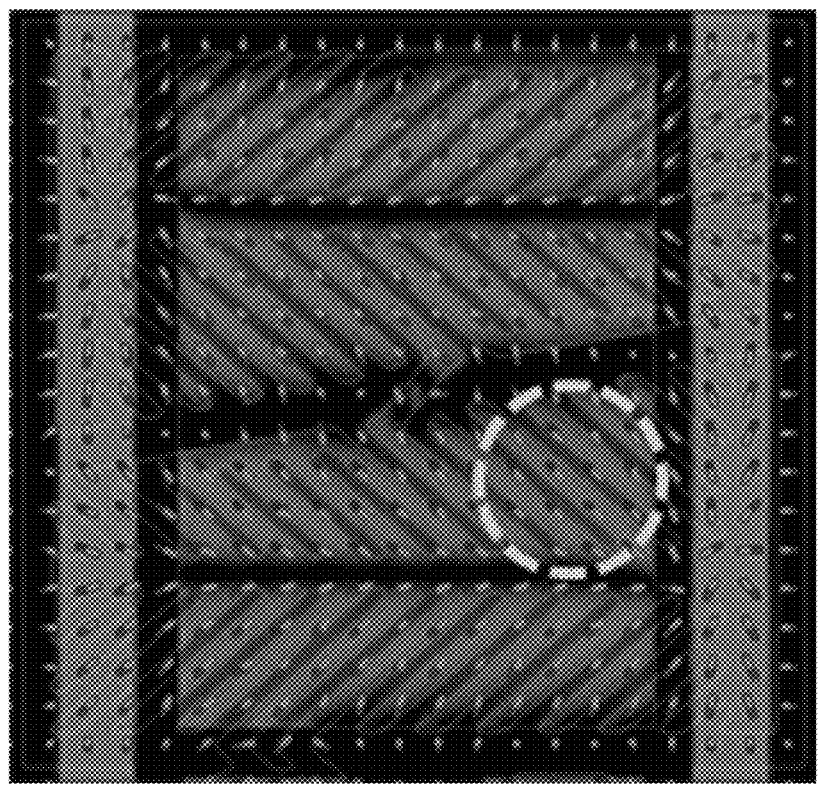
FIGS. 16(b) and 16(c) depict experimental results illustrating the improvement in movement of liquid crystal molecules in a liquid crystal display including a thin film transistor array panel according to an embodiment.
Figure 16C:
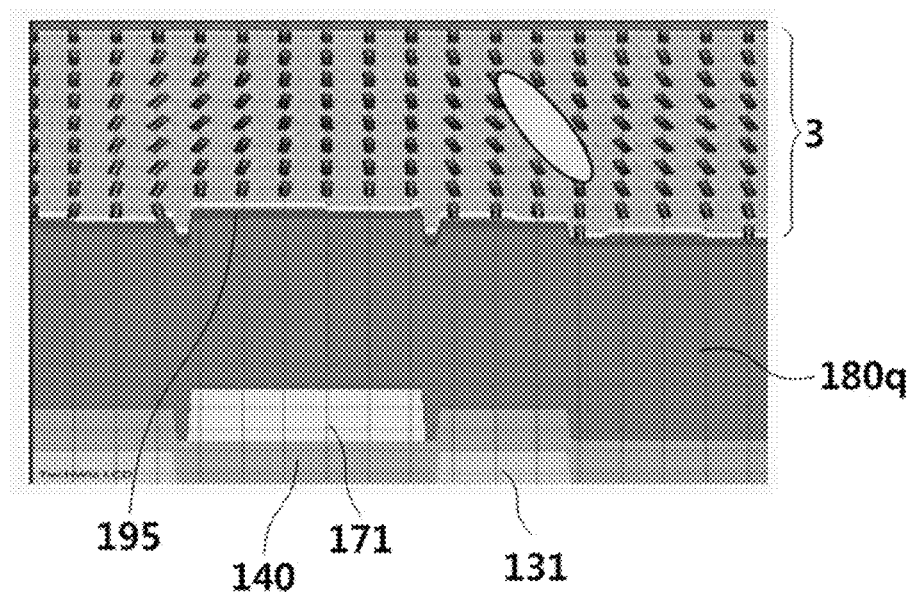

FIG. 16(a) depicts an experimental result illustrating the movement of liquid crystal molecules in a conventional liquid crystal display. FIGS. 16(b) and 16(c) depict experimental results illustrating the improved movement of liquid crystal molecules in a liquid crystal display including a thin film transistor array panel according to an embodiment.

Specifically, FIG. 16(a) illustrates generation of a dark portion in a liquid crystal display in a conventional thin film transistor array panel; FIG. 16(b) illustrates the improvement in the generation of a dark portion in a liquid crystal display including an exemplary thin film transistor array panel; and FIG. 16(c) illustrates the movement of liquid crystal molecules in the liquid crystal display including the exemplary thin film transistor array panel.

The experimental results in FIGS. 16(b) and 16(c) were obtained using a liquid crystal display including the thin film transistor array panel of FIG. 12. As shown in the marked arrow portion of FIG. 16, the liquid crystal molecules are aligned at an inclination angle in a direction of the protrusion 195 on the second passivation layer 180q formed by the data line 171.

In addition, it is observed that no dark portion was formed in the liquid crystal display including exemplary the thin film transistor array panel as a result of the inclination angle of the liquid crystal molecules.

As described above, the stems of the pixel electrode and the stems of the divided reference voltage line are horizontally disposed so as to reduce texture generated in a curved-type display panel. Also, a step or a protrusion is formed in the stem of the pixel electrode to prevent a dark portion from being generated in the stem of the pixel electrode.

While the inventive concept has been described in connection with what is presently considered to be exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A thin film transistor array panel comprising:
a first substrate;
a gate line on the first substrate;
a gate insulating layer disposed on the gate line;
a data conductor disposed on the gate insulating layer and comprising a first drain electrode and a second drain electrode;
a passivation layer covering the data conductor and having a first contact hole and a second contact hole;
a first subpixel electrode electrically connected with the first drain electrode through the first contact hole and a second subpixel electrode electrically connected with the second drain electrode through the second contact hole, wherein each of the first subpixel electrode and the second subpixel electrode includes a vertical stem, a horizontal stem, and a plurality of minute branches; and
a first protrusion disposed in at least one of the vertical stem of the first subpixel electrode and the vertical stem of the second subpixel electrode,
wherein the first protrusion protrudes in a direction perpendicular to a surface of the first substrate.

2. The thin film transistor array panel of claim 1, wherein the first protrusion protrudes from an area occupied by the vertical stem.

3. The thin film transistor array panel of claim 1, wherein each of the first and second subpixel electrodes includes a first horizontal stem and a second horizontal stem extending in a horizontal direction and a first vertical stem and a second vertical stem extending in a vertical direction,
wherein the first vertical stem is substantially perpendicular to the first horizontal stem and formed at one end of the first horizontal stem,
the second vertical stem is substantially perpendicular to the second horizontal stem and formed at one end of the second horizontal stem, and
the first vertical stem and the second vertical stem are disposed opposite to each other.

4. The thin film transistor array panel of claim 3, wherein a portion of the minute branches extending from the first horizontal stem of the first subpixel electrode and a portion of the minute branches extending from the second horizontal stem of the first subpixel electrode are connected with each other, and
  a portion of the minute branches extending from the second horizontal stem toward the gate line is connected with a widened portion of the first subpixel electrode and receives a voltage from the first drain electrode through the first contact hole.

5. The thin film transistor array panel of claim 4, wherein a portion of the minute branches extending from the first horizontal stem of the second subpixel electrode and a portion of the minute branches extending from the second horizontal stem of the second subpixel electrode are connected with each other, and
  a portion of the minute branches extending from the first horizontal stem toward the gate line is connected with a widened portion of the second subpixel electrode and receives a voltage from the second drain electrode through the second contact hole.

6. The thin film transistor array panel of claim 3, further comprising a divided reference voltage line,
  wherein the divided reference voltage line divides a first subpixel area corresponding to the first subpixel electrode into a first area and a second area, and surrounds three sides of each of the first and second areas,
  wherein the divided reference voltage line further divides a second subpixel area corresponding to the second subpixel electrode into a third area and a fourth area, and surrounds three sides of each of the third and fourth areas,
  wherein sides of the first subpixel area where the divided reference voltage line is not formed are disposed opposite to each other in the first and second areas, and
  wherein sides of the second subpixel area where the divided reference voltage line is not formed are disposed opposite to each other in the third and fourth areas.

7. The thin film transistor array panel of claim 6, wherein the first vertical stem of the first subpixel electrode and the first vertical stem of the second subpixel electrode overlap the divided reference voltage line, and
  the divided reference voltage line is formed crossing between the minute branches extending from the first horizontal stems of the first and second subpixel electrodes and the minute branches extending from the second horizontal stems of the first and second subpixel electrodes.

8. The thin film transistor array panel of claim 1, further comprising:
  a shielding electrode disposed at the same layer as the first and second subpixel electrodes,
  wherein the shielding electrode comprises a vertical portion overlapping the data line and a horizontal portion crossing between the first subpixel electrode and the second subpixel electrode.

9. The thin film transistor array panel of claim 1, further comprising a second protrusion protruding from at least a portion of the horizontal stem.

10. The thin film transistor array panel of claim 9, wherein the second protrusion protrudes from an area occupied by the vertical stem.

11. The thin film transistor array panel of claim 1, wherein the first protrusion protrudes at points where the vertical stem and the horizontal stem meet each other.

12. The thin film transistor array panel of claim 1, wherein the first subpixel electrode is disposed above the gate line and the second subpixel electrode is disposed below the gate line, in a plan view.

13. A liquid crystal display comprising:
a first substrate;
a gate line disposed on the first substrate;
a gate insulating layer disposed on the gate line;
a data conductor disposed on the gate insulating layer and comprising a first drain electrode and a second drain electrode;
a passivation layer covering the data conductor and having a first contact hole and a second contact hole;
a first subpixel electrode electrically connected with the first drain electrode through the first contact hole and a second subpixel electrode electrically connected with the second drain electrode through the second contact hole, wherein each of the first subpixel electrode and the second subpixel electrode includes a vertical stem, a horizontal stem, and a plurality of minute branches,
a second substrate disposed corresponding to the first substrate;
a liquid crystal layer disposed between the first substrate and the second substrate; and
a first protrusion disposed in the vertical stem of the first subpixel electrode and the vertical stem of the second subpixel electrode,
wherein the first protrusion protrudes toward the second substrate.

14. The liquid crystal display of claim 13, wherein the first protrusion protrudes from an area occupied by the vertical stem.

15. The liquid crystal display of claim 14, wherein each of the first subpixel electrode and the second subpixel electrode includes a first horizontal stem and a second horizontal stem extending in a horizontal direction and a first vertical stem and a second vertical stem extending in a vertical direction,
  wherein the first vertical stem is substantially perpendicular to the first horizontal stem and formed at one end of the first horizontal stem,
  the second vertical stem is substantially perpendicular to the second horizontal stem and formed at one end of the second horizontal stem, and
  the first vertical stem and the second vertical stem are disposed opposite to each other.

16. The liquid crystal display of claim 13, further comprising:
  a shielding electrode disposed at the same layer as the first and second subpixel electrodes,
  wherein the shielding electrode comprises a vertical portion overlapping the data line and a horizontal portion crossing between the first subpixel electrode and the second subpixel electrode.

17. The liquid crystal display of claim 13, wherein the first protrusion protrudes from an area occupied by the vertical stem and at least a portion of the horizontal stem.

18. The liquid crystal display of claim 13, wherein the first protrusion protrudes from points where the vertical stem and the horizontal stem meet each other.

19. A liquid crystal display comprising:
a first substrate;
a gate line disposed on the first substrate;
a gate insulating layer disposed on the gate line;
a data conductor disposed on the gate insulating layer and comprising a data line, a first drain electrode and a second drain electrode;

a passivation layer covering the data conductor and having a first contact hole and a second contact hole;

a first subpixel electrode electrically connected with the first drain electrode through the first contact hole and a second subpixel electrode electrically connected with the second drain electrode through the second contact hole, wherein each of the first subpixel electrode and the second subpixel electrode include a vertical stem, a horizontal stem, and a plurality of minute branches; and a protrusion disposed at a portion where the first and second subpixel electrodes overlap the data line, wherein the protrusion protrudes to a same height as the data line.

20. The liquid crystal display of claim 19, further comprising:

a second substrate disposed corresponding to the first substrate;

a common electrode formed on the second substrate; and a liquid crystal layer disposed between the first substrate and the second substrate, wherein the first subpixel electrode is disposed above the gate line and the second subpixel electrode is disposed below the gate line, and wherein the first subpixel electrode and the second subpixel electrode are formed horizontally and overlap an area where the data line is disposed.

* * * * *